(12) United States Patent
Ehm et al.

(10) Patent No.: US 7,959,310 B2
(45) Date of Patent: Jun. 14, 2011

(54) OPTICAL ARRANGEMENT AND EUV LITHOGRAPHY DEVICE WITH AT LEAST ONE HEATED OPTICAL ELEMENT, OPERATING METHODS, AND METHODS FOR CLEANING AS WELL AS FOR PROVIDING AN OPTICAL ELEMENT

(75) Inventors: Dirk Heinrich Ehm, Aalen (DE); Annemieke Van De Runstraat, Zoetermeer (NL); Bastiaan Theodoor Wolschrijn, Abcoude (NL); Arnoldus Jan Storm, Delft (NL); Thomas Stein, Oberkocken (DE); Marco G. H. Meijerink, The Hague (NL); A. G. Ton M. Bastein, Leiden (NL); Esther L. J. Van Soest-Vercammen, Soesterberg (NL); Norbertus Benedictus Koster, Delft (NL); Frits G. H. M. Gubbels, Helmond (NL); Peter J. Oprel, Delft (NL); Michiel Nienoord, Apeldoorn (NL); Michel Riepen, Delft (NL); Johannes Hubertus Josephina Moors, Helmond (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 510 days.

(21) Appl. No.: 11/854,621

(22) Filed: Sep. 13, 2007

(65) Prior Publication Data
US 2008/0143981 A1 Jun. 19, 2008

Related U.S. Application Data

(60) Provisional application No. 60/946,439, filed on Jun. 27, 2007.

(30) Foreign Application Priority Data

Sep. 13, 2006 (DE) .......................... 10 2006 042 987
Jun. 27, 2007 (DE) .......................... 10 2007 030 162

(51) Int. Cl.
*G02B 5/08* (2006.01)
*G02B 7/182* (2006.01)
*G06K 7/10* (2006.01)

(52) U.S. Cl. ........................................ 359/846; 359/350

(58) Field of Classification Search .................. 359/350, 359/351, 358, 359, 634, 726, 845, 846
See application file for complete search history.

(56) References Cited

U.S. PATENT DOCUMENTS 5,390,228 A * 2/1995 Niibe et al. .................... 359/846
(Continued)

FOREIGN PATENT DOCUMENTS

DE 10 2004 062 289 A1 7/2006
(Continued)

OTHER PUBLICATIONS

Michael Bass (Editor), Handbook of Optics, Fundamentals, Techniques and Design, 1995, vol. 1, Second Edition, Chapters 42.7-8, McGraw Hill, New York.

*Primary Examiner* — Alicia M Harrington
(74) *Attorney, Agent, or Firm* — Sughrue Mion, PLLC

(57) ABSTRACT

An optical arrangement, in particular a projection system, illumination system or beam shaping system for EUV lithography, including at least one optical element that is arranged in a beam path of the optical arrangement and that reflects radiation in the soft X-ray- or EUV wavelength range, wherein at least during operation of the optical arrangement at least one of, preferably each of, the reflective optical elements in the beam path, at least at the optical surface, has an operating temperature of approximately 30° C. or more, preferably of approximately 100° C. or more, particularly preferably of approximately 150° C. or more, and even more preferably of approximately 250° C. or more, and wherein the optical design of the at least one reflective optical element is selected such that its optical characteristics are optimised for operation at the operating temperature. Also presented is a method for providing a reflective optical element with such an optical design.

28 Claims, 5 Drawing Sheets

U.S. PATENT DOCUMENTS

| | | | |
|---|---|---|---|
| 6,846,086 B2 * | 1/2005 | Goldstein | 359/846 |
| 2006/0024589 A1 * | 2/2006 | Schwarzl et al. | 430/5 |
| 2006/0262308 A1 * | 11/2006 | Sekine | 356/399 |

FOREIGN PATENT DOCUMENTS

| | | |
|---|---|---|
| WO | WO 02/054115 A2 | 7/2002 |
| WO | WO 2004/104707 A2 | 12/2004 |

* cited by examiner

OPTICAL ARRANGEMENT AND EUV LITHOGRAPHY DEVICE WITH AT LEAST ONE HEATED OPTICAL ELEMENT, OPERATING METHODS, AND METHODS FOR CLEANING AS WELL AS FOR PROVIDING AN OPTICAL ELEMENT

CROSS-REFERENCE TO RELATED APPLICATIONS

This application claims the benefit under 35 U.S.C. 119(e)(1) of U.S. Provisional Application No. 60/946,439, filed Jun. 27, 2007, the entire contents of which are hereby incorporated by reference. This application also claims priority under 35 U.S.C. 119(a) to German Patent Application No. 10 2007 030 162.8 filed on Jun. 27, 2007, the entire contents of which are hereby incorporated by reference. This application further claims priority under 35 U.S.C. 119(a) to German Patent Application No. 10 2006 042 987.7, filed on Sep. 13, 2006, the entire contents of which are hereby incorporated by reference.

FIELD AND BACKGROUND OF THE INVENTION

The invention relates to an optical arrangement, in particular a projection system, an illumination system or a beam shaping system for EUV lithography, to an EUV lithography device comprising such an optical arrangement, to methods for operating such an optical arrangement and an EUV lithography device, respectively, as well as to methods for cleaning and for providing a reflective optical element, respectively.

Reflective optical elements for the extreme ultraviolet (EUV) range and the soft X-ray wavelength range (e.g. wavelengths between approximately 5 nm and 20 nm) such as photomasks or multilayer mirrors are in particular used in EUV lithography devices for producing semiconductor components. Since EUV lithography devices as a rule comprise several reflective optical elements, the reflectivity of the latter has to be as high as possible in order to ensure sufficiently high overall reflectivity. The reflectivity and thus the service life of the reflective optical elements can be reduced as a result of contamination of the optically active reflective surface of the reflective optical elements, which contamination arises as a result of short-wave radiation together with residual gases in the operating atmosphere. Since normally in an EUV lithography device several reflective optical elements are arranged one behind the other, even minor contaminations on each reflective optical element have a major effect on the overall reflectivity. It should be pointed out that hereinafter the term "light" refers not only to radiation at wavelengths in the visible spectrum, but in particular also to radiation in the EUV- or in the soft X-ray wavelength range.

Apart from the intensity of the EUV radiation, the partial pressure of the hydrocarbons in the environment close to the optically active surface plays a significant role in the growth of contamination. If a hydrocarbon molecule is adsorbed on the optical surface of an element, that is reflective to EUV radiation, said hydrocarbon molecule either directly condensates and/or reacts with the photons of the exposure radiation or the radiation-induced electrons (photo electrons) and forms, for example, an atomic carbon layer, wherein either case results in a loss of reflection on the reflective optical element.

Depending on the composition of the residual gas atmosphere, as described above, the contamination can contain carbon or hydrocarbon, or it can be somewhat oxidative, or may contain volatile metal hydrides which may lead to metal depositions on the optical surfaces. In order to counteract the contamination, above all, attempts are made to provide the reflective optical elements with protective layers that are more inert in relation to the respective residual gases than is the surface of the optically active area of the reflective optical elements. Furthermore, different cleaning methods are investigated in more detail, by means of which cleaning methods contamination is to be removed from the reflective optical elements without the optical characteristics of said optical elements being significantly impeded. For example, the approach is pursued wherein contamination comprising carbon is removed in that atomic hydrogen is introduced into a cleaning chamber, which atomic hydrogen reacts, in particular with the contamination that contains carbon on the surface of the reflective element that is located in the cleaning chamber, to form volatile compounds. To this effect the atomic hydrogen is obtained e.g. by heating molecular hydrogen to approximately 2400° C. by means of a heated filament.

However, due to its high reactivity, atomic hydrogen is difficult to handle. Producing it by means of a heated filament is also associated with a danger of introducing additional contamination, which originate, for example, from the heated filament itself.

From WO 2002/054115 A2 a device has become known in which an additional protective layer, e.g. of ruthenium, rhodium, palladium, iridium, platinum, and/or gold is applied to the reflective optical element. The protective layer can have a catalytic effect and can stimulate the reaction of gaseous substances e.g. molecular hydrogen with EUV radiation, which substances are supplied to the optical surfaces, so that carbon contamination deposited on the protective layer can be removed. It is proposed that to this effect the gaseous substance be supplied to the optical surface at pressures of between $10^{-8}$ and $10^{-4}$ torr.

Furthermore, at present, in EUV lithography devices, reflective optical elements are used at an operating temperature of approximately 60° C. or less, because at higher temperatures the diffusion between the individual layers of the reflective multilayer systems greatly increases at the optical surfaces of said multilayer systems, which leads to a reduction in the reflectivity. For this reason the components which are present in the vacuum housings of EUV lithography devices, which components outgas contaminating substances such as hydrocarbons, cannot be completely baked. As a result of this, in those instances the partial pressure of the hydrocarbons can only be reduced at considerable expenditure, which as a rule is not tolerable, e.g. with longer pumping periods, to values below $10^{-9}$ mbar so that there is a high probability of contamination, in particular non-volatile hydrocarbons, adhering to the optical surfaces, and/or in the immediate environment of the optical surfaces of the reflective optical elements, or that said contamination is adsorbed there.

From WO 2004/104707 A2 a method and a device for cleaning at least one reflective optical element has become known, which optical element is arranged in a vacuum chamber in the beam path of a radiation source for generating radiation in the soft X-ray wavelength range or in the EUV wavelength range. The reflective optical element is contaminated, at least in part, as a result of an inorganic substance introduced through the radiation source. Depending on the prevailing reaction conditions, at least one reaction partner, which is transparent in relation to the radiation, is admitted by way of a supply device, which reaction partner chemically reacts with the contaminating deposits for the purpose of removing them from the reflective optical element. The reaction partner can, for example, be molecular hydrogen, and for the purpose of desorption of the contamination the reflective optical element can be heated.

OBJECT OF THE INVENTION

It is an object of the invention to provide an optical arrangement, an EUV lithography device comprising such an optical arrangement, methods for operating such an optical arrangement and an EUV lithography device, respectively, as well as methods for cleaning and for providing a reflective optical element, respectively, which arrangements and methods improve the optical characteristics of the optical arrangement and/or of the optical element.

SUMMARY OF THE INVENTION

According to one aspect, this object is met by an optical arrangement, in particular a projection system, an illumination system or a beam shaping system for EUV lithography, comprising: at least one optical element that is arranged in a beam path of the optical arrangement and that reflects radiation in the soft X-ray- or EUV wavelength range, wherein for desorption of contamination, in particular of hydrocarbons, at least during operation of the optical arrangement at least one of, preferably each of, the reflective optical elements in the beam path, at least at the optical surface, has an operating temperature of approximately 30° C. or more, preferably of approximately 100° C. or more, particularly preferably of approximately 150° C. or more, in particular of approximately 250° C. or more, wherein for the purpose of heating the optical surface of at least one, preferably of each reflective optical element to operating temperature at least one heating element is provided, and wherein at least one control unit for controlling the temperature of at least one, preferably each of the reflective optical elements is provided, which control unit controls the heating power of the heating element by determining the radiation power which impinges on the optical surface.

By heating the optical surface of at least one reflective optical element to operating temperature the adsorption of contamination can be counteracted, or by thermal movement desorption of easily volatile contamination, in particular of hydrocarbons with an atomic mass of 100 or above, from the optical surfaces can take place. In this arrangement the determination of the operating temperature at which desorption commences depends of various factors, for example on the partial pressure of the contamination in the optical arrangement, which as a rule is operated under vacuum conditions. After desorption, the contaminating substances can be removed from the region of the beam path of the optical arrangement, as will be described in detail further below.

Reflective optical elements for the EUV wavelength range typically reflect only approximately two thirds of the incident EUV radiation; they absorb the remaining third so that during operation of the optical arrangement the temperature of said optical arrangement increases. While the first optical element downstream of the light source is still subjected to the full radiation output (whole spectrum) of said light source, the reflective optical elements that are arranged downstream in the beam path are impinged on by a radiation power that is reduced by the absorbed fraction. Therefore, during operation of the optical arrangement the reflective optical elements heat up to a different extent, depending on their position in the beam path, wherein in particular the first optical element in the beam path, provided it is not being cooled, may already have an operating temperature in which desorption of contamination commences. However, as a rule, in the case of optical elements that are arranged further downstream in the beam path this does not apply, because the radiation power is gradually reduced as the number of optical elements increases. The invention provides for at least one optical element to be heated to operating temperature by means of a heating element. In order to prevent contamination desorbed by a reflective optical element that is at operating temperature from depositing on another reflective optical element in the beam path of the optical arrangement, which is not heated, preferably all the optical elements in the beam path are kept at an operating temperature that is above a threshold temperature at which desorption of contamination commences.

Furthermore, the optical arrangement comprises at least one control unit for controlling the temperature of at least one, preferably each of the reflective optical elements in order to keep the operating temperature of the optical elements constant during exposure operation, because fluctuations in temperature can have a negative effect of the quality of exposure. Since during exposure operation the temperature of the optical elements changes as a result of any variation in the radiation intensity of the exposure radiation, a control unit can ensure that the heating power of the heating element is selected such that a constant operating temperature is generated. In this arrangement the heating power is controlled depending on the radiation power impinging on the optical surface, in that from the known adsorption characteristics of the reflective optical element and from the heat radiation given off by said optical element to the environment, and if applicable received by further components, which heat radiation can be determined or calculated by means of experiments, the actual temperature of the optical surface is determined, and, based on this calculation, the heating element is controlled such that the desired operating temperature at the optical surface is present.

In a preferred embodiment the control unit is designed to determine the radiation power impinging on the optical surface by means of a computational model that takes into account the radiation power emitted from an EUV light source to the optical surface. In this case the radiation power is determined in that the radiation power that has been emitted by the light source in a particular operating mode is used in order to determine the radiation power impinging on the reflective optical element so that as described above the required heating power can be determined.

In a further embodiment the optical arrangement comprises a radiation power meter for determining the radiation power impinging on the optical surface. In this case the radiation power is not calculated, but instead is determined directly by means of the radiation power meter, which can, for example, be designed as a semiconductor photo detector. Furthermore, in order to determine the radiation power, the photocurrent generated in the reflective optical element can be used, or a gas detector can be used which measures the photo ionisation, generated by the EUV radiation, in the residual gas atmosphere of the vacuum chamber, in which the reflective optical element is arranged, thus indirectly determining the radiation power. In this way in particular the radiation power impinging on the optical surface can also be determined locally.

It is understood that for determining the actual temperature of the at least one temperature-controlled reflective optical element, it is also possible to use at least one temperature sensor, which is used for in-situ measuring or in-operando measuring of the temperature at the optical surface. However, as a rule, said temperature sensor has to be arranged outside the optical surface, and consequently it is possible that the temperature on the optical surface cannot be determined with sufficient accuracy.

In an advantageous embodiment the control unit is designed to keep the at least one reflective optical element at operating temperature even during pauses in the operation of the optical arrangement, and consequently distortions of the optical element during cooling and subsequent renewed heating can be prevented.

A further aspect is implemented in an optical arrangement, in particular a projection system, illumination system or beam shaping system for EUV lithography, comprising: at least one reflective optical element for the soft X-ray- or EUV wavelength range with an optically active coating on a substrate on the side that is to be exposed to radiation, with a catalytic cover layer on top of said optically active coating, wherein the reflective optical element, at least in the region of the catalytic cover layer, has an operating temperature of approximately 150° C. and above; a hydrogen inlet for supplying molecular hydrogen at least to the region of the catalytic cover layer; as well as a control unit that is designed to supply the hydrogen at a partial pressure of between approximately 0.01 mbar and approximately 1 mbar.

By providing reflective optical elements with a catalytic cover layer and by ensuring an adequate energy supply by heating, molecular hydrogen can be split into atomic hydrogen directly at the catalytic cover layer. This not only provides an advantage in that it is now possible to work with molecular hydrogen, which can be handled much more easily and with less effort than is the case with atomic hydrogen, but also that the atomic hydrogen essentially arises at that location where it is required, namely at the surface of the reflective optical element that is to be cleaned, in particular, of contamination containing carbon. In this way the probability of the atomic hydrogen reacting with regions outside the reflective optical element that is to be cleaned, e.g. with other components or interior walls of an EUV lithography device, in which the reflective optical element with the catalytic cover layer is located, is considerably reduced. Because, for example, neither heated filament devices for obtaining atomic hydrogen, nor expensive protective measures for supplying atomic hydrogen to the optical element to be cleaned are required, the cleaning method can be used not only for in-situ cleaning, but also for on-line or in-operando cleaning, i.e. for cleaning reflective optical elements with a catalytic protective layer within an EUV lithography device during its operation, in other words when a photomask is being exposed to EUV radiation, and when the structure of said photomask is projected onto a semiconductor wafer.

The quantity of atomic hydrogen is controlled by way of the quantity of the supplied molecular hydrogen. If the reflective optical element is in a closed chamber for cleaning purposes, the partial pressure of the molecular hydrogen should be at least approximately 0.01 mbar so that a cleaning effect can be achieved. In particular in the case of in-situ cleaning or on-line or in-operando cleaning, the partial pressure should be at most approximately 1 mbar so as not to impede the operation of the EUV lithography device or of the illumination system or projection system that comprises a reflective optical element with a catalytic cover layer. In the case of cleaning in a dedicated cleaning chamber, if need be partial pressures of more than 1 mbar may be used. However, with the temperature at the same time being as high as several hundred degrees Celsius there is a danger of not only the contamination being removed, but also of sufficient atomic hydrogen with adequate activation being present for said hydrogen to be able to a major extent to diffuse into the topmost layers of the reflective optical element, thus impeding the characteristics of the reflective optical element.

The atomic hydrogen that arises on the heated catalytic cover layer reacts particularly well with contamination that contains carbon to form volatile compounds. However, oxidised surfaces can also be reduced by the atomic hydrogen, as a result of which oxidative contamination is also reduced. Also, metal deposits can be removed from the heated catalytic cover layer, the metal deposits reacting with atomic hydrogen to form volatile metal hydrides.

The catalytic cover layer preferably comprises a transition metal, in particular of group VIII, e.g. in pure form or as an alloy or as a component of a compound. Further preferred, the catalytic cover layer can comprise a substance from the group consisting of: ruthenium, rhodium, palladium, platinum, molybdenum, iridium, osmium, rhenium, nickel, silver, gold or zinc oxide.

In a preferred embodiment the optical arrangement further comprises a heating device for heating the at least one reflective optical element to operating temperature, which heating device is preferably arranged on the side of the substrate that points away from the optically active coating. Cleaning with catalytically produced atomic hydrogen is particularly efficient for reflective optical elements that comprise not only a catalytic cover layer but also their own heating device. In this way the reflective optical element can be heated in a targeted manner in order to promote the cleaning process, or during switching-off of the heating device in order to reduce or interrupt said cleaning process. This is advantageous in particular in the case of in-situ cleaning and on-line or in-operando cleaning. Furthermore, as a result of the targeted heatability of the reflective optical element, from an energy point of view economical efficiency is ensured. Likewise, from a design point of view it can also be advantageous not to provide a dedicated heating device at each reflective optical element, but instead, if need be, by way of an external heating device, to heat at least some of the reflective optical elements of an arrangement to a temperature that is adequate for the above-mentioned catalytic processes. This can be more economical from an energy point of view, e.g. in the case of compact arrangements with rather small distances between the individual reflective optical elements and with external dimensions that are not very large.

A further aspect is implemented in an optical arrangement, in particular a projection system, illumination system or beam shaping system for EUV lithography, comprising: at least one optical element that is arranged in a beam path of the optical arrangement and that reflects radiation in the soft X-ray- or EUV wavelength range, wherein at least during operation of the optical arrangement at least one of, preferably each of, the reflective optical elements in the beam path, at least at the optical surface, has an operating temperature of approximately 30° C. or more, preferably of approximately 100° C. or more, particularly preferably of approximately 150° C. or more, in particular of approximately 250° C. or more, wherein the optical design of the at least one reflective optical element is selected such that its optical characteristics are optimised for operation at operating temperature.

In particular, the term "optical design" refers to the form of the optical surface of the optical element, which has been selected such that the desired optical characteristics are present at operating temperature. At room temperature the optical element(s) in this case, however, has/have a shape, in particular a curvature at the optical surface or a thickness of individual layers of a reflective multilayer system, which during operation of the optical arrangement at room temperature does not reflect the light in the desired manner so that at room temperature it is not possible to achieve optimal results with the optical arrangement. The at least one optical element, is made with an optical design whose shape has been selected such that the deformations as a result of thermal expansion during heating to operating temperature have already been taken into account. In particular, the optical element can comprise a not-yet completely elliptical, hyperbolic, or spherical shape at room temperature, which shape transforms to the desired elliptical, hyperbolic or spherical end shape only as a result of thermal expansion. Moreover, at room temperature the optical element can have wave front errors that are corrected only after heating.

In a preferred embodiment the optical design of the at least one optical element has been selected such that at least one imaging error of the optical arrangement is optimised, in particular minimised, at operating temperature. In this embodiment the optical arrangement is an imaging optical arrangement which can, for example, be used to image a structure onto a light-sensitive substrate at a reducing scale.

In a preferred embodiment the imaging error is selected from the group consisting of: uniformity, telecentricity, pupil ellipticity and pupil apodisation. These imaging errors are errors that are typically encountered in imaging systems, which errors, as a rule, cannot be corrected independently of each other, so that minimising one imaging error may increase another imaging error. Preferably, for optimisation, the above-mentioned and, if applicable, further imaging errors are set such that the image has a desired imaging quality at operating temperature that can depend on the respective application in which the optical arrangement is used.

In a preferred embodiment, all the reflective optical elements have the same operating temperature. In order to achieve this, those optical elements that are subjected to a lesser radiation power are heated up more than those optical elements that are subjected to a greater radiation power. In this way a situation is achieved in which desorption of the contamination on all the optical elements remains approximately the same so that the desorbed contamination, if it has not been previously removed from the optical arrangement, cannot, due to any temperature gradients that may be present, migrate to that optical element that has the lowest operating temperature. When providing individual heating elements for the optical elements, their heating powers should be matched to each other so as to achieve a uniform operating temperature.

In a further exemplary embodiment the reflective optical elements comprise an optically active coating, which is temperature-resistant at operating temperature, in particular a reflective multilayer system. For reflecting radiation by means of interference effects, such multilayer systems comprise alternate layers of a high and low refractive index. In addition, as a rule, the surface of the multilayer systems, which surface faces away from the substrate, comprises a cap layer that does not contribute to interference and that comprises a material on which contamination is not deposited as easily as is the case with layers situated underneath, which cap layer preferably comprises a catalytic material. In the case of operating temperatures exceeding approximately 60° C., in the case of usual Si/Mo layer systems, the above-mentioned diffusion process between the individual layers occurs. At higher operating temperatures it is thus necessary to provide layer systems in which the diffusion process is prevented or at least reduced. To this effect, barrier layers, e.g. comprising $B_4C$ and/or $SiN_x$ between the individual layers of the multilayer system can be provided so that diffusion of the material of one layer into an adjacent layer can be prevented.

Recently, the Fraunhofer Institute in Jena has been developing multilayer systems that are reported to be thermally stable up to temperatures of approximately 500° C., wherein the multilayer systems comprise $Mo_2C/Si$ layers. Such layers can be used for coating collector mirrors that are immediately downstream of the EUV radiation source. According to the invention, high-temperature resistant layer systems are not only used for the optical element immediately downstream of the EUV radiation source, but also for further, preferably for all, optical elements of the optical arrangement.

In a further preferred embodiment the optical arrangement comprises at least one cooling element for cooling at least the optical surface of at least one reflective optical element. The cooling element can be provided in addition to the heating element, e.g. when the heating element is too inert, i.e. its temperature as a result of a reduction in the heat power changes only slowly. As an alternative, a combined cooling/heating system can be provided, which comprises, for example, a pipeline system through which, depending on requirements, optionally cold or hot liquids can be fed. However, the cooling element can also be used in optical elements that need not be heated actively by means of a heating element because they already attain the operating temperature as a result of exposure radiation. In this case the operating temperature can be controlled by means of the cooling element as a regulating element. In addition, in this arrangement a heating element, e.g. a heating wire, can be provided in order to ensure that the operating temperature can also be attained during pauses in the operation of the optical arrangement.

In a further advantageous embodiment the optical arrangement comprises at least one adsorption element with an adsorption surface for the adsorption of contamination. The contaminating substances desorbed from the optical surfaces can be accommodated on the adsorption surface. The adsorption elements are preferably arranged in close proximity to the optical surfaces, e.g. in their edge regions.

In a preferred improvement the adsorption element is operatively connected to a cooling unit that is designed to cool the adsorption surface to temperatures of less than 290 K, preferably of less than 80 K, particularly preferably of less than 20 K. In order to cool the adsorption surface to these temperatures, coolant in the form of water, liquid nitrogen or liquid helium could be used. In this way a so-called cryo panel is produced on the adsorption surface, which cryo panel binds the contaminating particles to the adsorption surface. In this case the adsorption surface can be roughened to increase its accommodation capacity (increase in the effective surface).

In a further advantageous improvement the adsorption surface, at least in a partial region, comprises a gas-binding material, in particular titanium, tantalum, niobium, zirconium, thorium, barium, magnesium, aluminum, ruthenium, ytterbium or cerium. On the adsorption surface volatile and non-volatile hydrocarbons, gaseous metal compounds and organic materials containing sulphur, phosphorus or silicon, in particular silicon compounds, siloxanes, phthalates, hydrocarbons with carbonyl functions (e.g. methylmethacrylate, acetone etc.), sulphur dioxide, ammonia, organophosphates, aliphatic hydrocarbons, aromatic hydrocarbons, perfluorated hydrocarbons etc. can be bound as contaminating substances. Apart from binding such contaminating substances by out-condensation, as described above, said contaminating substances can also be adsorbed by the above-mentioned gas-binding substances, wherein in this case too an increase in the effective accommodation capacity of the surface can be achieved in that the surface available for adsorption is increased by suitable structuring. Apart from the metals mentioned, if need be, molecular sieves or activated carbon can also be used as gas-binding materials.

In a particularly advantageous embodiment the optical arrangement comprises a suction device for removing the desorbed contamination by suction. To this effect, as a rule, the suction device communicates with a vacuum pump by means of which the contamination can be removed from the optical arrangement. In this arrangement the suction device is preferably arranged near the optical surfaces, or a preferred direction of pumping is ensured.

A further aspect of the invention is implemented in an EUV lithography device comprising an illumination system, a projection system and/or a beam shaping system as an optical arrangement, which systems are designed as described above. The systems mentioned and the EUV lithography device can be designed to allow cleaning not only in situ but also on-line or in-operando. Consequently, downtimes are considerably reduced because there is no need to deinstall any reflective optical elements for the purpose of cleaning them, and moreover, in particular, because the exposure process does not have to be interrupted. Because in such an in-operando process cleaning can take place with comparatively little effort, cleaning can be carried out more often or on a permanent basis. Consequently, there is less contamination growth between two cleaning cycles, which contamination growth can already be removed by means of lesser atomic hydrogen concentrations or heating, or there is no contamination regrowth at all. More gentle cleaning leads to a reduction in the impairment of the optical characteristics of the reflective optical element to be cleaned, which impairment is, for example, caused by inhomogeneities on the optical surface. With continuous cleaning it is even possible to reach a state of equilibrium in which it is possible to keep contamination permanently at a negligible level. With the above-mentioned systems or with the EUV lithography device it is also possible either to provide dedicated heating devices on individual reflective optical elements, or by way of a shared heat source to bring two or more reflective optical elements to an operating temperature of approximately 150° C. and above.

However, even with cleaning taking place in off-line operation, by means of desorption of the contamination the service life of the optical elements in the EUV lithography device can be prolonged, or the operating period of the EUV lithography device between cleaning processes can be extended.

Furthermore, by providing optical elements in the above-mentioned systems, which optical elements are optimised for use at operating temperature, the exposure quality, in particular the imaging quality, of the EUV lithography device can be enhanced.

A further aspect is implemented in a method for operating an optical arrangement, in particular a projection system, an illumination system or a beam shaping system for EUV lithography, in which method, for desorption of contamination, in particular of hydrocarbons, at least during operation of the optical arrangement at least one of, preferably each of, the optical elements in the beam path of the optical arrangement, which optical elements are reflective to radiation in the EUV wavelength range, at least at the optical surface, is kept at an operating temperature of approximately 30° C. or more, preferably of approximately 100° C. or more, particularly preferably of approximately 150° C. or more, in particular of approximately 250° C. or more, in that by means of at least one heating element at least one, preferably each, reflective optical element is heated to operating temperature, wherein the heating power of the at least one heating element is controlled by determining the radiation power impinging on the optical surface. It is understood that in this case, too, the optical elements that may be arranged in the beam path so as to be downstream of the EUV light source have already been heated to operating temperature by the exposure radiation. Preferably, the radiation power impinging on the optical surface is determined by a computational model that takes into account the radiation power emitted onto the optical surface by an EUV light source, and/or by a radiation meter. Furthermore, preferably, even during pauses in operation of the optical arrangement the at least one reflective optical element is kept at operating temperature.

A further aspect is implemented in a method for cleaning a reflective optical element, in particular for the soft X-ray- or EUV wavelength range, with a catalytic cover layer, which method comprises the steps of: heating the reflective optical element, at least in the region of the catalytic cover layer, to approximately 150° C. and more; and supplying molecular hydrogen at least in the region of the catalytic cover layer, wherein the hydrogen is supplied at a partial pressure of between approximately 0.01 mbar and approximately 1 mbar. The optical element can, for example, be arranged in a cleaning chamber or in a vacuum chamber of an EUV lithography device provided for this purpose.

Heating the reflective optical element to approximately 170° C., preferably approximately 200° C. and above, has been shown to be particularly advantageous.

Preferably, both steps of the method are carried out while the reflective optical element is in operation. This is particularly advantageous because when the cleaning method is applied while the reflective optical element is in operation, it is possible to reduce deposits of contamination on said optical element, or, in particular if the method is applied from commencement of operation, it is possible to prevent the occurrence of such deposits entirely.

A further aspect is implemented in a method for operating an EUV lithography device with at least one reflective optical element for the soft X-ray- or EUV wavelength range, with a catalytic cover layer, which method comprises the steps of: heating the reflective optical element at least in the region of the catalytic cover layer to approximately 150° C. and more; and supplying molecular hydrogen, at least in the region of the catalytic cover layer, wherein the hydrogen is supplied at a partial pressure of between approximately 0.01 mbar and approximately 1 mbar. The partial pressure range mentioned has been shown to be particularly suitable for in-operando cleaning. In this method, the at least one reflective optical element is preferably heated homogeneously.

A further aspect is implemented in a method for providing a reflective optical element for the soft X-ray- or EUV wavelength range for operation at an operating temperature of approximately 30° C. or more, preferably of approximately 100° C. or more, particularly preferably of approximately 150° C. or more, in particular of approximately 250° or more, with a first optical design having optical characteristics that are optimised for the operating temperature, the method comprising the step of providing the reflective optical element at a temperature below the operating temperature with a second optical design that is selected such that after heating to operating temperature the first optical design is generated. The optical element is thus produced with a second optical design, which differs from the first optical design, in which the optical element is operated. In this method the optical element is typically provided with the second optical design after the production of the optical element has been finished, i.e. usually at room temperature (approx. 20° C.).

In an advantageous variant the second optical design is determined from the first optical design, taking into account the thermal expansion of the reflective optical element during heating to operating temperature. Starting from the first optical design, taking into account the thermal expansion coefficient of the materials used in the optical element, the second optical design can be calculated, which has to be present at a lower temperature, typically at room temperature, so that the first, desired, optical design is generated at operating temperature. It is understood that the second optical design can also be determined by measurement, for example in that the deformation of the optical element across a determined temperature range is determined.

In a further advantageous variant the reflective optical element is provided at room temperature, and the second optical design is selected such that when the reflective optical element is heated from room temperature to operating temperature, the first optical design is generated. In this case the optical element is manufactured such that after manufacture, at room temperature, the second optical design is present so that the change in shape as a result of thermal expansion when heating from room temperature to operating temperature can be brought about.

In a further preferred variant the optical element is provided for operation in an optical arrangement, wherein the first optical design is determined such that at least one imaging error of the optical arrangement is optimised, which imaging error is preferably selected from the group comprising: uniformity, telecentricity, pupil ellipticity and pupil apodisation. In this arrangement the determination of the optical design of the individual optical elements arises from the determination of the overall design of the optical characteristics of the (imaging) optical arrangement at operating temperature.

Further characteristics and advantages of the invention are provided in the following description of exemplary embodiments of the invention, by means of the figures of the drawing that show details which are significant in the context of the invention, and in the claims. The individual characteristics can be implemented individually per se, or they can be implemented to form several characteristics in any combination in a variant of the invention.

BRIEF DESCRIPTION OF THE DRAWINGS

Exemplary embodiments are shown in the diagrammatic drawing and are explained in the description below. The following are shown.

DETAILED DESCRIPTION OF PREFERRED EMBODIMENTS

Figure 1:
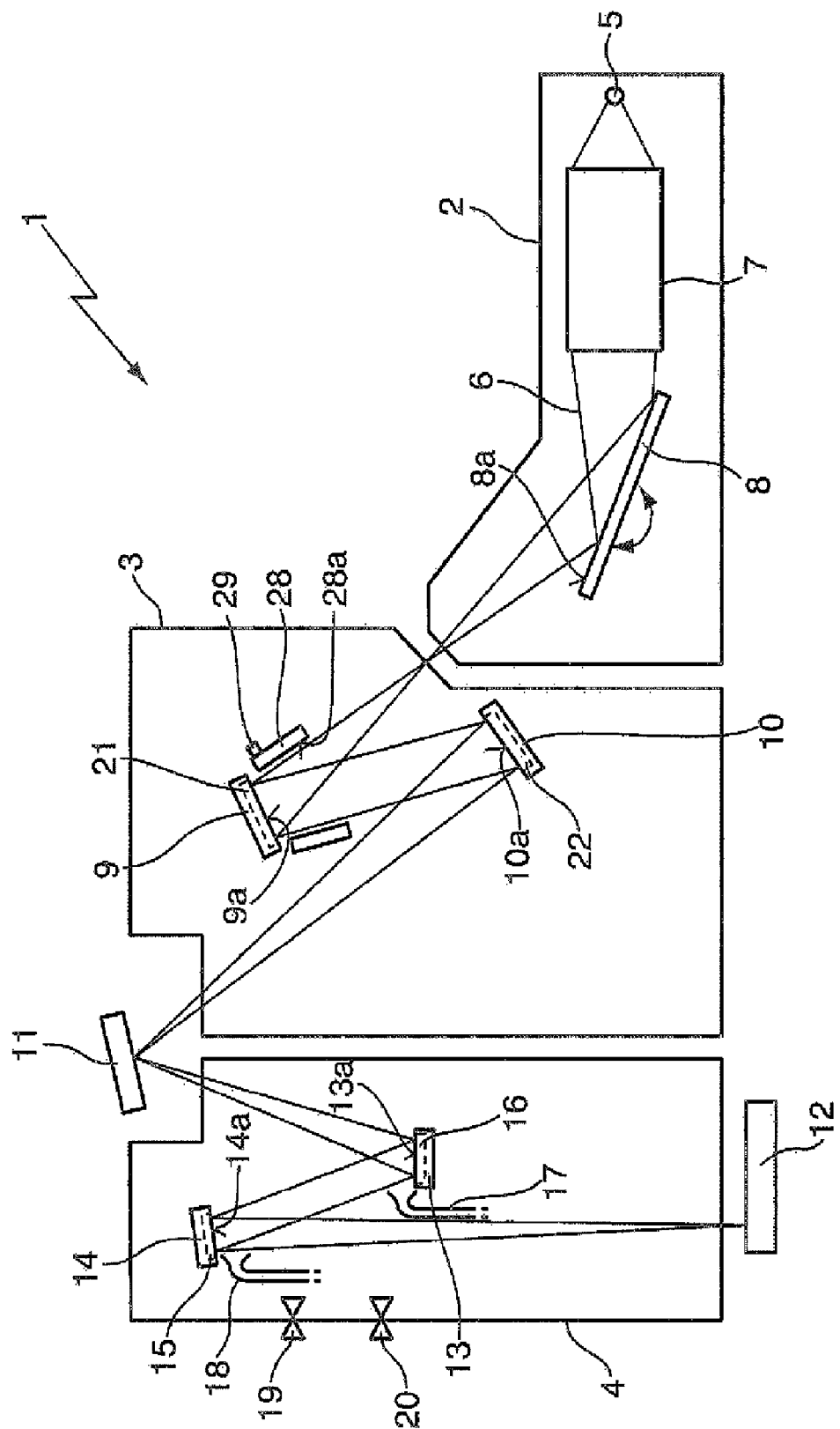
FIG. 1 a diagrammatic view of an embodiment of the EUV lithography device according to the invention, comprising an adsorption element.

FIG. 1 diagrammatically shows an EUV lithography device 1 which comprises a beam shaping system 2, an illumination system 3 and a projection system 4 which are arranged one after the other in a beam path 6 which emanates from an EUV light source 5 of the beam shaping system 2. For example a plasma source or a synchrotron can be used as an EUV light source 5. The radiation emanating in the wavelength range of between approximately 5 nm and approximately 20 nm is first concentrated in a collimator 7. By means of a subsequent monochromator 8, by varying the angle of incidence, as indicated by a double arrow, the desired operating wavelength is filtered out.

The radiation treated in the beam shaping system 2 as far as wavelength and spatial distribution is concerned is introduced into the illumination system 3 that comprises a first and a second reflective optical element 9, 10. The two reflective optical elements 9, 10 guide the radiation onto a photomask 11 as a further reflective optical element which photomask 11 comprises a structure that by means of the projection system 4 is imaged at a reducing scale onto a wafer 12. To this effect, a third and a fourth reflective optical element 13, 14 are provided in the projection system 4.

In the EUV lithography device 1 shown in FIG. 1, the third and the fourth reflective optical element 14, 15 are in each case connected to an associated heating element 15, 16 that comprises heated filaments that are connected to a power supply (not shown). The heating elements 15, 16 are used for homogeneous heating of the optical surfaces 13a, 14a of the two reflective optical elements 13, 14 in the beam path 6 to an operating temperature that in the example shown is above approximately 150° C. At this operating temperature of the optical surfaces, desorption of contaminating particles, in particular of hydrocarbons, from the optical surfaces 13a, 14a occurs. By means of suction devices 17, 18 that are arranged adjacent to the optical surfaces 13a, 14a, said particles are removed from the reflective optical elements 14, 15 by means of a vacuum pump (not shown), in each case by way of an associated outlet 19, 20, from the projection system 4 which is operated under vacuum conditions.

Likewise, the optical surfaces 9a, 10a of the first and the second optical elements 9, 10 of the illumination system 3 are operated at an operating temperature above 150° C. In order to heat the second optical element 10 to operating temperature, it comprises an integrated heating element 22. During the exposure process, the first optical element 9 is heated by the exposure radiation to an operating temperature that is significantly above 150° C. Cooling is required to prevent the first optical element 9 from being destroyed.

Usually it is favourable if at least all the optical elements 9, 10 13, 14 of the projection system 4 and of the illumination system 3 are kept at operating temperature even during pauses in operation of the EUV lithography device 1 so as to prevent distortion as a result of cooling and subsequent heating, and also to avoid waiting times during renewed operation of the EUV lithography device 1. In order to cool the first optical element 9 both during illumination operation and during pauses in exposure, a combined cooling and heating element 21 has been integrated in said optical element 9, which cooling and heating element 21 comprises a pipeline system through which cold or hot liquids can be channeled, depending on requirements. As an alternative, electronic heating or cooling elements can also be used for this purpose, e.g. heating wires or Peltier elements.

For operation of the EUV lithography device 1 it is favourable if the reflective optical elements 9, 10, 13, 14 of the illumination system 3, as well as of the projection system 4, and the reflective optical elements 7, 8 of the beam shaping system 2, as well as the reflective photomask 11, are kept at a constant operating temperature. For this reason the aforesaid each comprises a temperature control device which below is described in more detail with reference to the second optical element 10 of the illumination system 3, which is shown in detail in FIG. 3.

Figure 3:
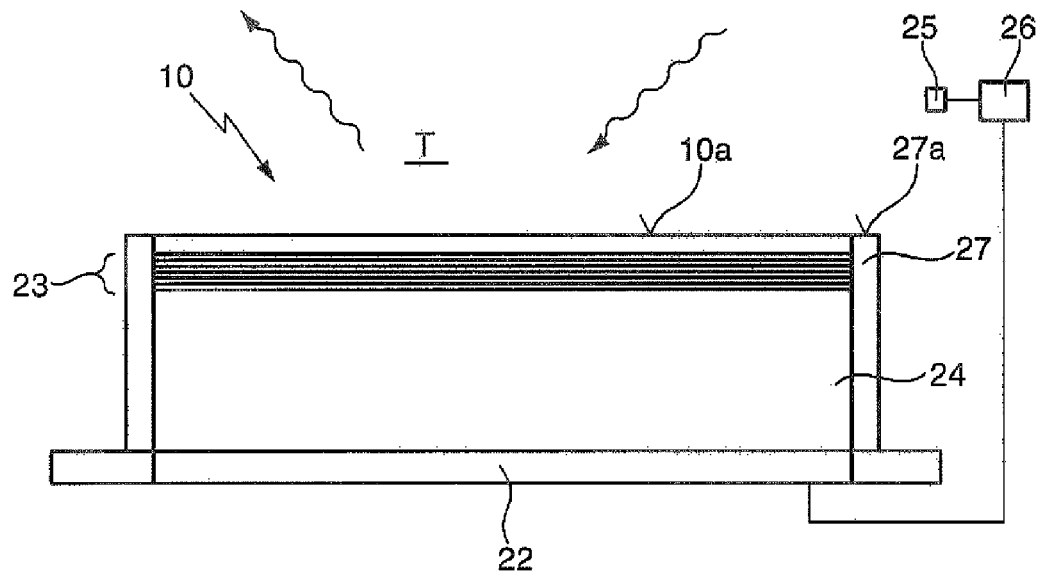
FIG. 3 a diagrammatic view of a reflective optical element in the EUV lithography device according to FIG. 1.

The reflective optical element 10 shown in FIG. 3 comprises a multilayer system 23 that has been applied to a substrate 24. In the present case the multilayer system 23 is designed as an $Mo_2C/Si$ layer system; it thus provides temperature resistance up to operating temperatures of approximately 500° C. At the top of the multilayer system a cover layer has been applied as protection against contamination or oxidation. Below the substrate 24 the heating element 22 is arranged.

Adjacent to the optical beam path 6 (compare FIG. 1) a gas detector as a radiation power meter 26 is arranged, which detects the quantity of the residual gas ionised by the radiation, and from this determines the radiation power of the radiation impinging on the optical surface 10*a*. The radiation meter 25 is connected to a control device 26, which comprises a computation device (not shown) which, from the radiation power impinging on the optical element 10 and from the known adsorption characteristics of the optical element 10 as well as from the heat radiation given off to the environment, which heat radiation can be determined by experiments, calculates the actual temperature of the optical surface 10*a*. Based on this calculation, the control device 26 controls the heating element 22 such that the desired constant operating temperature T at the optical surface 10*a* comes into existence during exposure operation. As an alternative to the control system shown which uses a radiation meter, the radiation power can be determined by way of a computational model that is based on the radiation power provided by the EUV light source 5 in a particular operating mode. In this case, too, the required heating performance can be determined. If need be, control can also take place in that a temperature sensor for determining the actual temperature is used, which is preferably arranged on the substrate 24 so as to be adjacent to the optical surface 10*a*. In addition or as an alternative to the option, described in the context of FIG. 1, of removing contaminations from the region of the EUV lithography device 1 by means of suction devices 17, 18, it is possible, on the optical element 10, to provide an adsorption element 27 which surrounds the substrate 24, e.g. in a ring-shaped manner, and which comprises a gas-binding material, in particular titanium, tantalum, niobium, zirconium, thorium, barium, magnesium, aluminum, ytterbium or cerium. In this case, the contaminated substances that have been desorbed from the optical surface 10*a* are adsorbed on an adsorption surface 27*a* of the adsorption element 27. In this arrangement it is favourable if the temperature of the adsorption element 27 is lower than the operating temperature T of the optical surface 10*a* so that a temperature gradient in radial direction can be generated, as a result of which a situation can be achieved in which the contaminating substances move radially outwards from the optical surface 10*a* of the optical element 10 towards the adsorption surface 27*a*.

In addition or as an alternative, further adsorption elements can be provided in the EUV lithography device 1, which adsorption elements are based on the principle of condensing-out contaminating substances. FIG. 1 shows such a further ring-shaped adsorption element 28 by way of an example. The further adsorption element 28 is connected to a cooling device 29, which cools an adsorption surface 28*a* of the adsorption element 28 to a temperature of less than 80 K. In this arrangement, for example, liquid nitrogen or liquid helium can be used for cooling. In this way a so-called cryo panel is produced on the adsorption surface 28*a*, which cryo panel binds the contaminating substances by outcondensing.

For all optical elements 7 to 11, 13, 14 either a uniform temperature can be selected, or said elements 7 to 11, 13, 14 are operated at different operating temperatures, which in each case have to be above a threshold temperature at which desorption commences. The threshold temperature depends on various factors, e.g. on the partial pressures of the contaminating substances in the EUV lithography device 1 that is operated under vacuum conditions, wherein said threshold temperature can be higher or lower than described herein. By holding all the reflective optical elements 7 to 11, 13, 14 of the EUV lithography device 1 at an operating temperature above the threshold temperature, contaminating substances will find it difficult to lodge on the optical surfaces 8*a* to 11*a*, 13*a*, 14*a* of said EUV lithography device 1, or said contaminating substances are desorbed from said optical surfaces 8*a* to 11*a*, 13*a*, 14*a* and led away from them, e.g. in the manner described above, and are subsequently adsorbed or removed from the EUV lithography device 1. By reducing the contamination on the optical surfaces 8*a* to 11*a*, 13*a*, 14*a*, the service life of the optical elements 7 to 11, 13, 14 or the cleaning cycle of the EUV lithography device 1 is extended.

In addition to the desorption of contamination solely by heating the optical elements 7 to 11, 13, 14, further measures can be undertaken to effectively remove the contamination from said optical elements 7 to 11, 13, 14, as is shown below with reference to FIG. 2 and FIGS. 4 to 6.

Figure 2:
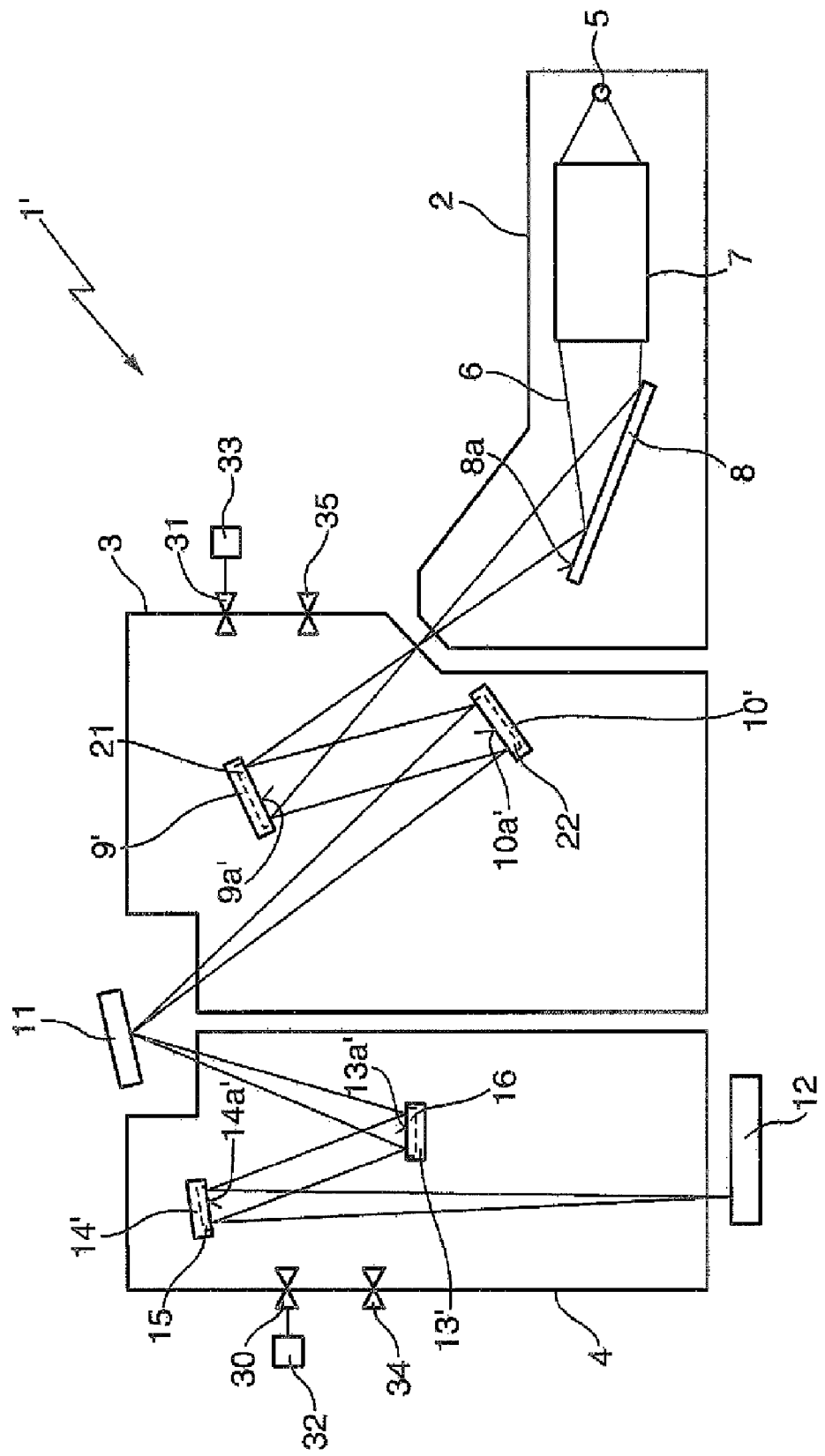
FIG. 2 a diagrammatic view of a further embodiment of an EUV lithography device according to the invention, comprising hydrogen inlets.
Figure 4:
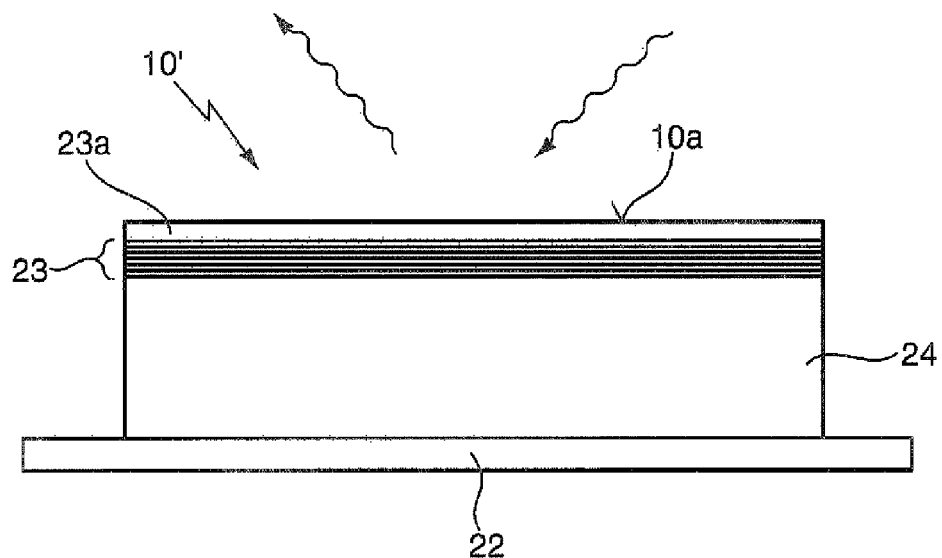
FIG. 4 a view of an optical element analogous to that of FIG. 3 in the EUV lithography device of FIG. 2.

As an example, FIG. 4 shows a reflective optical element 101, e.g. a photomask or a mirror, which is, for example, suitable for an EUV lithography device 1' shown in FIG. 2, and which firstly differs from the optical element 10 shown in FIG. 3 in that no adsorption element 27 is provided. The optical element 10' shown as an example in FIG. 4 is arranged in a hydrogen-containing atmosphere and comprises a substrate 24 to which an optically active coating has been applied, which in the present example is a multilayer system 23, i.e. as described above alternately applied layers of a slightly absorbent material (also referred to as a "spacer") and a strongly absorbent material (also referred to as an "absorber"). Consequently in a certain way a crystal is simulated whose lattice planes correspond to the absorber layers on which Bragg reflection takes place. For the extreme ultraviolet and soft X-ray wavelength range, very often silicon is used for the spacer layers, while molybdenum is used for the absorber layers. However, other material combinations are also suitable for the extreme ultraviolet and soft X-ray wavelength range, for example molybdenum/beryllium, ruthenium/silicon, molybdenum carbide/silicon etc. Generally speaking, in the individual materials there should be a large difference in the refractive index in the region of the operating wavelength. Furthermore, layers ma de of more than two materials can also be combined to form recurring layer units. In the present example layers are arranged between the actual absorber layers and spacer layers, which in-between layers act as diffusion barriers, for example silicon nitride, boron carbide, molybdenum carbide etch, so that even at elevated temperatures the layer structure of the multilayer system 23 remains intact. The thicknesses of the individual layers and of the recurring layer units depend on the choice of materials and on the planned operating wavelength. The thicknesses of the individual layers and of the recurring layer units can either be constant across the entire multilayer system 23, or they can vary, depending on the particular reflection profile that is to be achieved.

The multilayer system 23 has been applied to the side of the reflective optical element 10, which side is exposed to the EUV radiation or soft X-ray radiation. Above the multilayer system 23 there is a cover layer 23a from a catalytic material. With an adequate energy supply, e.g. in the form of heat, on this cover layer 23a, molecular hydrogen is split into atomic hydrogen. Advantageously a transition metal, in particular of group VIII, in pure form or as an alloy or as part of a compound, is selected for the catalytic cover layer 23a. Ruthenium, rhodium, platinum, palladium, molybdenum, osmium, iridium, rhenium, nickel, silver, or gold are particularly preferred catalytic cover layer materials, as are metal oxides, for example zinc oxide. The embodiment shown in FIG. 4, for example, shows a ruthenium layer. The thickness of the catalytic cover layer 23a is selected such that the influence on the optical characteristics of the reflective optical element 10 is as small as possible or by means of adaptations in the layer structure of the multilayer system 23 can be corrected as well as possible.

On the side opposite the multilayer system 23 the reflective optical element 10 of FIG. 4 comprises a heating device 22. In particular in the case of conventional heating devices, which operate with the Joule effect in that a wire-shaped electrical conductor is routed in an area on the underside of the substrate, this has an advantage in that even with close routing of the electrical conductor, in other words with small spaces between adjacent sections of the electrical conductor, no homogeneous heating in close proximity to such a heating device can be achieved. In contrast to this, in the example shown in FIG. 4, the quantities of heat, which emanate from each conductor section, can propagate in the substrate 24 and to a small extent also in the multilayer system 23 such that when the catalytic cover layer is reached, in this case the ruthenium layer 23a, the temperature distribution across the entire area is essentially homogeneous.

Homogeneous heating across the surface is important in particular with a view to the multilayer system 23 and in the case of on-line or in-operando cleaning. For, with inhomogeneous heating the layer thicknesses in the multilayer system would change differently as a result of different thermal expansion at various positions, which would lead to an undesirable variation in the reflection behaviour across the surface, which in particular in EUV lithography of larger-area structures can lead to undesirable imaging errors.

The atomic hydrogen arising on the heated catalytic cover layer 23a reacts particularly well with contamination that contains carbon, so as to form volatile compounds; however, oxidised surfaces, too, can be reduced by means of the atomic hydrogen, as a result of which oxidative contamination is also reduced.

By means of direct contact of the heating device 22 with the reflective optical element 10', very efficient thermal transfer can be achieved even in a vacuum in the case of in-situ-, on-line- or in-operando cleaning in an EUV lithography device or in some other X-ray-optical device in which a corresponding reflective optical element is used. Other heating devices can, for example, also be based on indirect heating, for example by means of IR radiation. In particular in arrangements of several reflective optical elements at short spacing, a heating device affixed near one of the reflective optical elements can also sufficiently heat the adjacent reflective optical elements. Likewise, one or several heating devices or external thermal sources that are independent of the reflective optical elements can be used.

The catalytic cover layer 23a should be heated to at least approximately 150° C. so that catalytic splitting of molecular hydrogen to atomic hydrogen can take place at sufficient quantities for a cleaning effect. The hydrogen then reacts in particular with contamination that contains carbon, and forms volatile hydrocarbon compounds. The higher the temperature of the catalytic cover layer 23a, the higher the rate at which it is covered with atomic hydrogen which can then react with contamination. Preferably, the catalytic cover layer 23a is heated to a temperature of approximately 170° C., particularly preferably to approximately 200° C. or more. Depending on the quality of the optically active surface, for example of the multilayer system 23 of the reflective optical element 10, it is possible to apply temperatures of approximately 250° C., approximately 300° C. or far above this.

The quantity of atomic hydrogen can also be controlled by way of the quantity of the fed-in molecular hydrogen. If for cleaning purposes, the reflective optical element 10' is in a closed chamber, the partial pressure of the molecular hydrogen should be at least approximately 0.01 mbar in order to be able to achieve a cleaning effect. In particular in the case of in-situ- and on-line- or in-operando cleaning, the partial pressure should at most be approximately 1 mbar so as not to impede operation of the EUV lithography device or of the exposure- or projection system that contains a reflective optical element with a catalytic cover layer. If cleaning takes place in a dedicated cleaning chamber, if need be, partial pressures exceeding 1 mbar can be applied. However, if at the same time the temperature is as high as several hundred degrees Celsius, there is a danger of not only the contamination being removed, but instead of such a quantity of atomic hydrogen with adequate activation being present that it can diffuse to a substantial extent into the topmost layers of the reflective optical element 10', and in this way can impede the characteristics of the reflective optical element 10'.

In a variant for reflective optical elements that are subjected to very intensive EUV radiation or soft X-ray radiation, and that are thus subjected to an already very considerable thermal load, in particular in the normal case where it is not the entire area of the reflective optical element that is illuminated, the heating device can be arranged on the sides adjoining the optically active surface or can even be arranged in the edge region of the catalytic cover layer itself, so as to bring the entire area to a homogeneous temperature despite there being only local radiation. In the case of a very small radiation spot and a limited area that is optically utilised, even in the case of lower-intensity radiation, the heating device can be provided on the sides or on the cover layer, because the optically active region can have an adequately homogeneous temperature distribution although the margin regions are adequately heated for the catalytic process for decomposition of molecular hydrogen to take place. In an extreme case in such an arrangement, the catalytic cover layer can also be provided only in the edge region that is not optically used. However, often the catalytic cover layer also assumes a protective function against mechanical wear in other cleaning processes or against oxidation if oxygen water or other compounds containing oxygen, e.g. alcohol or acetone, are present in the residual-gas atmosphere.

It should be pointed out that apart from the number of hydrogen atoms available for cleaning, the carbon growth on reflective optical elements such as EUV mirrors indirectly correlates with the intensity of the incident radiation. The EUV radiation or the soft X-ray radiation itself, or the photoelectrons or secondary electrons generated by radiation, already to a small extend result in the splitting of molecular hydrogen or of hydrocarbon compounds to form atomic hydrogen or smaller molecules that contain carbon, which molecules can deposit on the optically active area of the reflective optical element. Therefore the processes taking place to some extent constitute a self-regulating system in which an equilibrium of carbon-growth and carbon-cleaning can form.

FIG. 2 diagrammatically shows an EUV lithography device 1' that differs from the EUV lithography device 1 of FIG. 1 essentially in that in the device 1 of FIG. 1 no adsorption elements and no suction devices are provided. Components that serve the same purpose as those in FIG. 1 are denoted by identical reference numerals in FIG. 2. For a description of the function of the EUV lithography device 1' reference is made to the corresponding description in the context of FIG. 1.

In the above-mentioned wavelength range the collimator 7 and the monochromator 8 of the beam forming system 2 are usually designed as reflective optical elements, wherein at least the monochromator 8, on its optical surface, does not comprise a multilayer system, so as to reflect the widest wavelength range as possible. Frequently, collimators are designed as dish-shaped reflective optical elements to achieve a focusing or collimating effect. Reflection of the radiation takes place on the concave surface, wherein for reflection often no multilayer system is used on the concave area because as wide a wavelength band as possible is to be reflected. Filtering out a narrow wavelength band by reflection takes place on the monochromator, often by means of a grid structure or a multilayer system. Irrespective as to how the desired reflection on the collimator 7 or on the monochromator 8 has been caused, they can comprise a catalytic cover layer which, e.g., is heated by means of a heating device (not shown) on the collimator 7 and/or on the monochromator 8 so as to clean contamination from said catalytic cover layer or so as to prevent the formation of contamination.

In the example shown in FIG. 2, the illumination system 3 comprises two mirrors 9', 10', each comprising a catalytic cover layer 9a', 10a', wherein said mirrors 9', 10' can be heated either together or independently of each other. The mirrors 9', 10' guide the beam onto the photomask 11, which comprises the structure that is to be imaged onto the wafer 12. The photomask 11 is also a reflective optical element for the EUV- and soft X-ray wavelength region with a heatable catalytic cover layer, however, in the example shown said element cannot be cleaned in-situ or on-line or in-operando. However, since photomasks, depending on the manufacturing process, are exchanged anyway, this has no serious negative consequences on the downtimes of the EUV lithography device 1'. By means of the projection system 20, the beam reflected by the photomask 11 is projected onto the wafer 12, and consequently the structure of the photomask 11 is imaged onto said wafer 12. In the example shown, the projection system 4 comprises two heatable mirrors 13', 14', each with a catalytic cover layer 13a', 14a'. It should be pointed out that both the projection system 4 and the illumination system 3 can comprise a single mirror or three, four, five and more mirrors, of which one mirror or several mirrors can be heatable by way of one or several shared heat sources or heating devices, and can comprise one catalytic cover layer or several catalytic cover layers. Likewise, as option, a heatable photomask 11 with a catalytic cover layer can be used, and said cover layer may or may not be exposed to an $H_2$ atmosphere.

In the example shown in FIG. 2 both on the illumination system 3 and on the projection system 4 in each case a hydrogen inlet 30, 31 is provided for the supply of molecular hydrogen, by way of which hydrogen inlets 30, 31 a hydrogen atmosphere can be set as required, either continuously or for cleaning cycles. In this arrangement the hydrogen inlets 30, 31 are controlled by way of a respective control unit 32, 33 in order to supply the molecular hydrogen at a partial pressure of between approximately 0.01 mbar and approximately 1 mbar.

When heating the mirrors 9', 10', 13', 14', it must be taken into account that the heat power is matched to the EUV radiation power to which the mirrors 9', 10', 13', 14' are subjected if each of them has a dedicated heating device. In particular the first mirror 9' in the beam path is subjected to a particularly substantial heat load so that the heat power can be controlled so as to be less than that in the subsequent mirrors 10', 13, 14'.

It should also be pointed out that in contrast to conventional EUV lithography devices there is no need to provide cooling devices, which are commonly found on the first mirror in the beam path, because in the present EUV lithography device 1 the influence of the heat load is utilised and supported.

In addition, in each case a supply 35 on the illumination system 3 and a supply 34 on the projection system 4 are provided, by way of which a compound With an electronegative element can be introduced, which element can deposit on the surface of the reflective optical elements. Observations have shown that reflective optical elements that have a cover layer comprising a transition metal, in particular of group VIII, can be effectively protected from contamination, by way of a type of protective layer with a thickness that can also be less than that of a monolayer, on the basis of an electronegative element. The electronegative element is adsorbed or chemisorbed by the group VIII metal and consequently blocks surface locations that consequently can no longer be occupied by other atoms or molecules. This effect seems to also extend to the next and next-but-one adjacent locations, which might perhaps be explained by the electro-negativity of the element. Occupation of the surface locations among other things prevents adsorption of contamination that contains carbon.

Furthermore, the oxidation resistance of the cover layer is also improved, and absorption and dissociation of oxygen on the cover layer surface is prevented. This effect is particularly pronounced in a ruthenium cover layer in which the surface locations are filled with sulphur. However, contamination can also be reduced or prevented with cover layers made of the following metals: rhodium, platinum, palladium, iridium, silver, gold, ruthenium, molybdenum, osmium or rhenium, whose surface locations are filled with the electronegative elements sulphur, iodine, phosphorus, arsenic or with a cyanide group.

Advantageously, before initial operation, a reflective optical element comprising a cover layer made of a transition metal of group VIII or of gold or silver is provided with a corresponding protective layer by treating it with a gaseous compound that comprises an electronegative element or a cyanide group, which protective layer can be refilled during operation of the reflective optical element or during interruptions in the operation, in that the corresponding gaseous compound is fed to the surface of the reflective optical element. In this way contamination is effectively suppressed from the beginning. If, in particular in the case of ruthenium cover layers, sulphur is used for filling in the surface locations, preferably sulphuric gases are fed in. Particularly preferable are, for example, hydrogen sulphide, dimethylsulphide and thiophen. If contamination suppression by means of a heated catalytic cover layer in an atmosphere containing hydrogen is combined with the last-mentioned approach by a corresponding selection of the cover layer material, it is, for example, possible to run both processes in parallel in that the compound comprising the electronegative element or a cyanide group is fed at such low partial pressure that the cover layer surface is only partly covered with the electronegative element so that still an adequate quantity of molecular hydrogen can be catalytically decomposed to form atomic hydrogen. With the use of ruthenium and sulphur, in this case hydrogen sulphide could also be fed-in in order to make it possible to operate both processes with one gas. On the other hand it is also possible to make use of the second process only when, e.g. due to an oxygen leak or humidity leak, commencement of oxidative contamination is detected, which commencement is better met by filling the surface locations with an electronegative element than with catalytically obtained atomic hydrogen.

Figure 5:
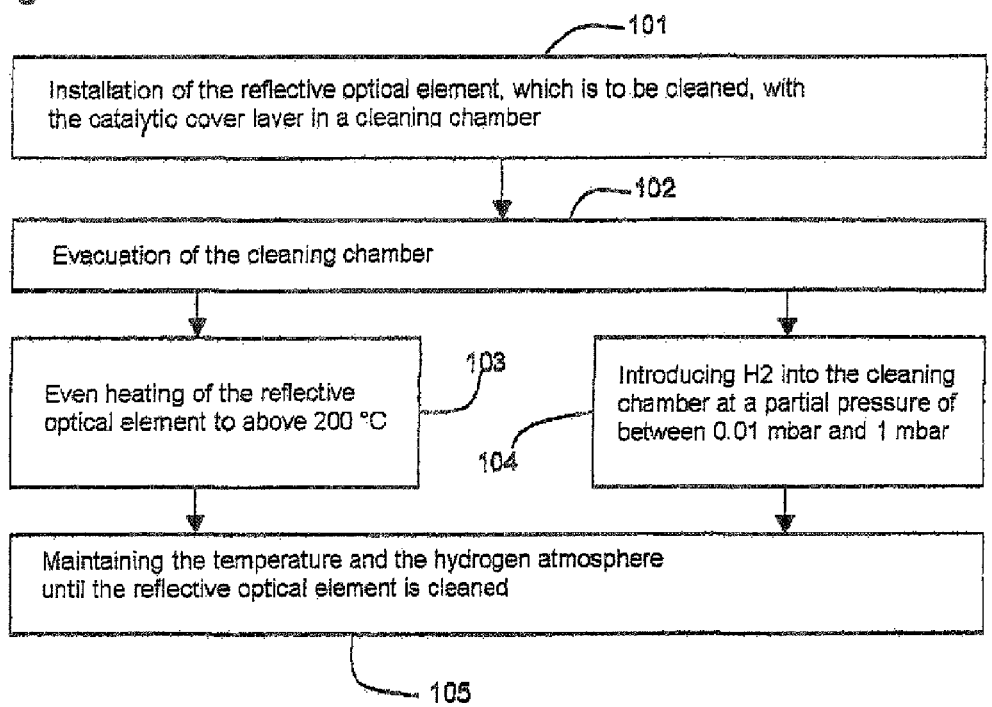
FIG. 5 a flow chart relating to a variant of a cleaning method for a reflective optical element.

By means of a flow chart, FIG. 5 shows the sequence of an embodiment of the method for cleaning a reflective optical element with a catalytic cover layer. This involves, for example, cleaning outside an EUV lithography device or outside an illumination or projection system. First, the reflective optical element to be cleaned is installed in a cleaning chamber (step 101). Thereafter the cleaning chamber is evacuated (step 102) so as to then at the same time heat the reflective optical element to above 200° C. and to feed molecular hydrogen at a partial pressure of between 0.01 mbar and 1 mbar into the cleaning chamber (steps 103, 104), wherein as an alternative these two steps can also be carried out in any sequence one after the other. Subsequently the temperature and the hydrogen atmosphere are maintained until the reflective optical element is cleaned (step 105). If the contamination is so strong that the catalytic cover layer is already fully covered so that it is no longer possible for catalysis to take place, it is also possible to first carry out an additional conventional cleaning process, e.g. with the use of atomic hydrogen generated by means of a heated filament, which cleaning process can however be terminated before damage to the surface of the reflective optical element takes place because the final cleaning is achieved by way of the method described in this document.

Figure 6:
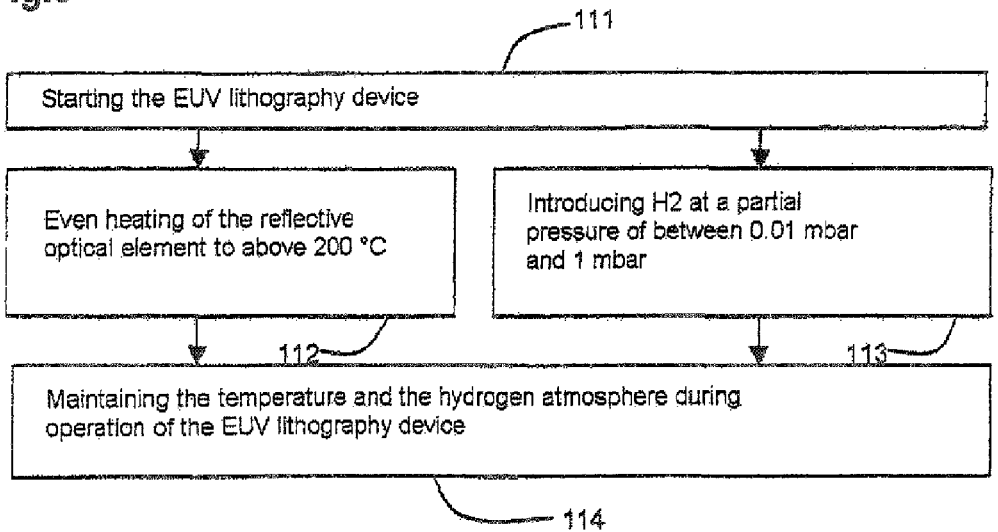
FIG. 6 a flow chart relating to a variant of an operating method for an EUV lithography device, and FIGS. 7a,b two reflective elements of the EUV lithography device of FIG. 1 (a) at room temperature and (b) at operating temperature.

By means of a flow chart, FIG. 6 shows the sequence of an embodiment of the method for operating an EUV lithography device with at least one reflective optical element with a catalytic cover layer. In this arrangement the reflective optical element, of which there is at least one, can be situated in the illumination system or in the projection system. It can also be the photomask. First, the EUV lithography device is operated in the usual manner (step 111). This includes among other things the installation and the set-up of the reflective optical elements in a vacuum, as well as commencement of the illumination process by radiating EUV- or soft X-rays. Thereafter at the same time the reflective optical element, of which there is at least one, with a catalytic cover layer is heated to above 200° C., and molecular hydrogen is introduced at a partial pressure of between 0.01 and 1 mbar (steps 112, 113), wherein these two steps can optionally also be carried out in any sequence one after the other. If this takes place as soon as possible after start-up of the EUV lithography device, it becomes possible to effectively prevent significant contamination from building up in the first place. Subsequently, the temperature and the hydrogen atmosphere are maintained during further operation (step 114). If applicable, it may be sufficient to heat the reflective optical elements with a catalytic cover layer and to supply hydrogen only at certain intervals.

The methods and components described herein make possible low-contamination and inexpensive operation of EUV lithography devices with short downtimes, which results in increased economy of EUV lithography devices. It is understood that components described in the context of FIGS. 1 and 3, and FIGS. 2 and 4 can also be present jointly in an EUV lithography device. In particular, the method described in the context of FIG. 6 can also be implemented on the EUV lithography device 1 of FIG. 1, which EUV lithography device 1 has to be suitably modified for this purpose; and temperature control as described in the context of FIG. 1 can be implemented on the EUV lithography device 1' of FIG. 2.

Furthermore, irrespective of the above-described measures for temperature control or atomic hydrogen cleaning of the optical elements of the EUV lithography devices 1, 1', the imaging quality can also be improved in that the optical elements that are heated to temperatures of, for example, approximately 150° C. or more are provided with an optical design that has been selected such that its optical characteristics are optimised for such an operating temperature.

Figure 7A:
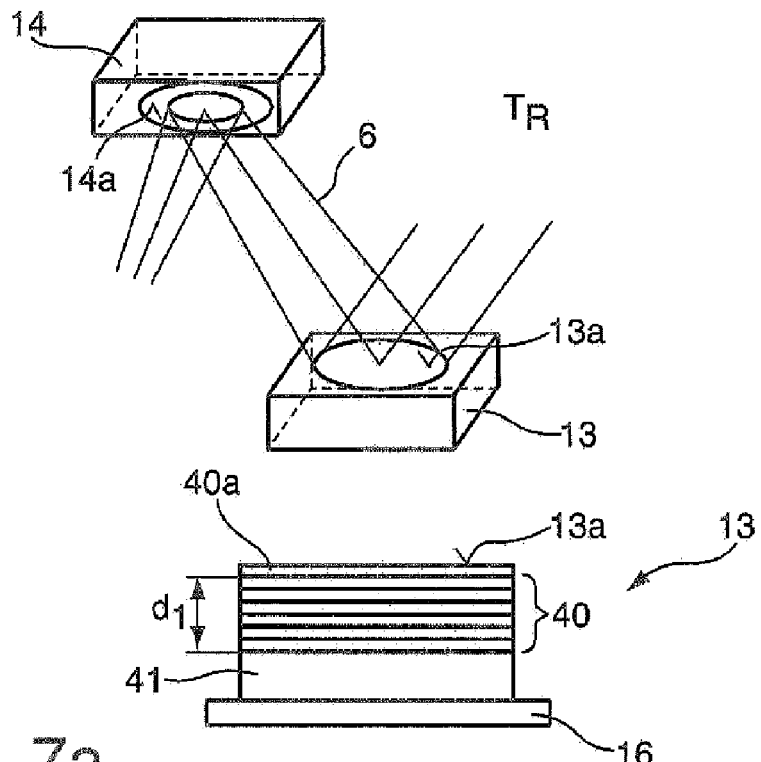
Figure 7B:
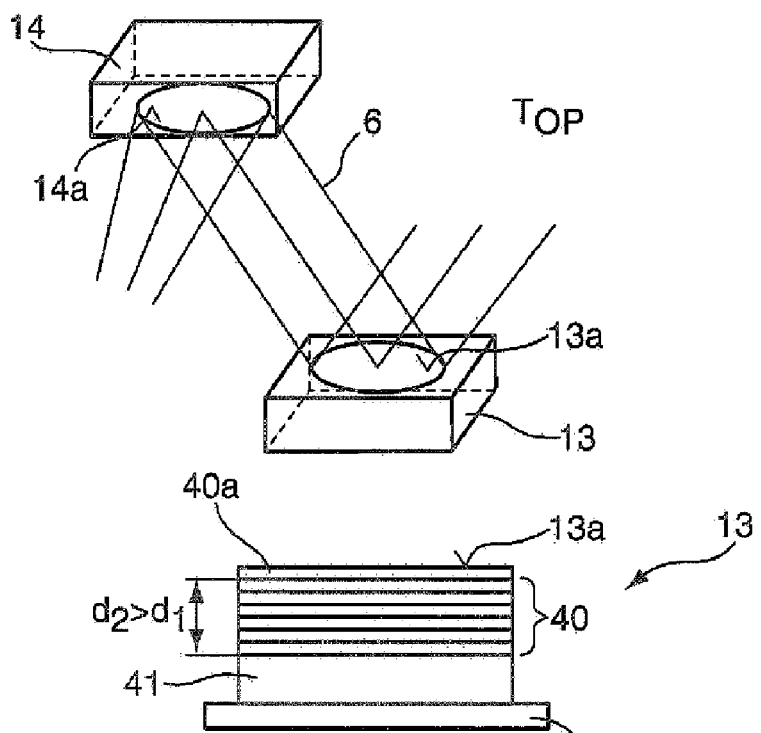

In this respect, FIGS. 7a,b show the two reflective elements 13, 14 of the projection system 4 of FIG. 1 at room temperature $T_R$ (20° C.) and at operating temperature $T_{OP}$ (150° C.), respectively. In FIG. 7a, the radiation of the beam path 6 impinges on the entire optical surface 13a of the third reflective optical element 13, yet is reflected only to a small circular area of the optical surface 14a of the fourth optical element 14, thus leading to an imaging error, namely to a degradation of the uniformity, of the projection system 4. This loss of uniformity is due to the fact that the third optical element 13, shown in FIG. 7a in a sectional view, comprises a multilayer system 40 with alternating high and low index layers having a thickness $d_1$ as an optical design characteristic which is not optimized for the imaging at room temperature $T_R$. In contrast to this, when the optical elements 13, 14 are heated to operating temperature $T_{OP}$, as shown in FIG. 7b, the thermal expansion of the multilayer system 40 leads to a higher thickness $d_2 > d_1$ of the multilayer system 40, so that the radiation reflected from the third optical element 13 impinges on the entire optical surface 14a of the fourth optical element 14.

Although thermal expansion also takes place for a cover layer 40a provided on the multilayer system 40, for a substrate 41 underneath the multilayer system 40, and for the heating element 16 on which the substrate 41 is arranged, the relevant optical design characteristic in this case is the varying thickness $d_1$, $d_2$ of the multilayer system 40, as essentially only its alternating layers contribute to the reflection of radiation from the optical surface 13a.

In summary, the optical element 13 is produced with a second optical design, resp., optical design characteristic $d_1$ for room temperature $T_R$ which is selected such that the desired first optical design, resp., optical design characteristic $d_2$, is generated at operating temperature $T_{OP}$. Consequently, when manufacturing the third optical element 13, the thermal expansion due to the heating from room temperature $T_R$ to operating temperature $T_{OP}$ needs to be taken into account, which may be done by calculations based on the thermal expansion coefficients of the materials involved, or by measurements.

The fourth optical element 14 undergoes the same change of thickness due to the heating as the third optical element 13 and is therefore also optimized for the operating temperature $T_{OP}$, its optical design at room temperature $T_R$ being transformed to the desired optical design at operating temperature $T_{OP}$. It is understood that not only the optical elements 13, 14 of the projection system 4, but also the optical elements of the beam shaping system 2 and the illumination system 3 of FIG. 1 and also the optical elements of the EUV lithography system 1' of FIG. 2 may be provided with designs which are optimized for the operating temperature $T_{OP}$. Furthermore, the person skilled in the art will appreciate that design characteristics other than the thickness of the multilayer system 40, e.g. the shape of the optical surface 13a, may be optimized at the operating temperature $T_{OP}$ as well. In the latter case an optical element is manufactured with a shape at room temperature which differs from the optimal, e.g. elliptical, flat or parabolic shape at the operating temperature. In this way the uniformity and further imaging errors of the EUV lithography devices 1, 1', e.g. telecentricity, pupil ellipticity, or pupil apodisation can be corrected for, and, in particular, the transmission of these devices can be maximized at the operating temperature $T_{OP}$.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical arrangement, comprising:
   at least one reflective optical element that is arranged in a beam path of the optical arrangement and that reflects radiation in the soft X-ray- or EUV wavelength range,
   wherein the at least one reflective optical element has an optical surface, and the optical surface has an optical design,
   wherein the optical design comprises a reflective multilayer system further comprising a plurality of layers having a high refractive index alternately arranged with a plurality of layers having a low refractive index,
   wherein at least during operation of the optical arrangement the optical surface has an operating temperature of at least 30° C.,
   wherein the optical design of the optical surface is configured to change with the temperature of the optical surface so that the optical arrangement exhibits predetermined optical characteristics at the operating temperature, and
   wherein the optical design of the optical surface is configured to change a thickness of at least one of: at least one layer of the plurality of layers of the high refractive index, or at least one layer of the plurality of layers of the low refractive index, in accordance with the temperature of the optical surface.

2. The optical arrangement according to claim 1, wherein the operating temperature for the at least one reflective optical element is at least 150° C.

3. The optical arrangement according to claim 1, wherein the optical design of the least one optical element is configured to reduce at least one imaging error of the optical arrangement at the operating temperature.

4. The optical arrangement according to claim 3, wherein the imaging error is selected from the group consisting of: uniformity, telecentricity, pupil ellipticity and pupil apodisation.

5. The optical arrangement according to claim 1, wherein the operating temperature for all the reflective optical elements is the same.

6. The optical arrangement according to claim 1, wherein the optical surfaces of the reflective optical elements comprise an optically active coating that is temperature-resistant at the operating temperature.

7. The optical arrangement according to claim 1, further comprising at least one cooling element for cooling the at least one reflective optical element.

8. The optical arrangement according to claim 1, further comprising at least one adsorption element with an adsorption surface for the adsorption of contamination.

9. The optical arrangement according to claim 8, wherein the adsorption element is operatively connected to a cooling unit for cooling the adsorption surface to temperatures of less than 290 K.

10. The optical arrangement according to claim 8, in which the adsorption surface, at least in a partial region, comprises a gas-binding material selected from the group consisting of: titanium, tantalum, niobium, zirconium, thorium, barium, magnesium, aluminium, ruthenium, ytterbium and cerium.

11. The optical arrangement according to claim 8, further comprising a suction device for removing the desorbed contamination by suction.

12. The optical arrangement according to claim 1, further comprising at least one heating element for heating the optical surface of the at least one reflective optical element to the operating temperature.

13. The optical arrangement according to claim 12, further comprising at least one control unit for controlling the temperature of the at least one reflective optical element, which control unit controls heating power of the heating element by determining a radiation power impinging on the optical surface.

14. The optical arrangement according to claim 13, wherein the control unit determines the radiation power impinging on the optical surface with a computational model factoring in the radiation power emitted from an EUV light source to the optical surface.

15. The optical arrangement according to claim 13, further comprising at least one radiation meter for determining the radiation power impinging on the optical surface.

16. The optical arrangement according to claim 13, wherein the control unit maintains the at least one reflective optical element at the operating temperature even during pauses in operation of the optical arrangement.

17. The optical arrangement according to claim 1, wherein the at least one reflective optical element comprises an optically active coating on a substrate on a side positioned for exposure to radiation, and a catalytic cover layer over the optically active coating, wherein the reflective optical element, at least in a region of the catalytic cover layer, has an operating temperature of at least approximately 150° C.; and
   wherein the optical arrangement further comprises a hydrogen inlet for supplying molecular hydrogen at least to the region of the catalytic cover layer; and a control unit that supplies the hydrogen at a partial pressure of between approximately 0.01 mbar and approximately 1 mbar.

18. The optical arrangement according to claim 17, in which the catalytic cover layer comprises a transition metal.

19. The optical arrangement according to claim 17, wherein the catalytic cover layer comprises a substance selected from the group consisting of:
   ruthenium, rhodium, palladium, platinum, molybdenum, iridium, osmium, rhenium, nickel, silver, gold and zinc oxide.

20. An EUV lithography device comprising an optical arrangement according to claim 1, the optical arrangement being selected from the group consisting of: an illumination system, a projection system, and a beam shaping system.

21. The optical arrangement according to claim 1, wherein the optical characteristics of the optical arrangement are at least substantially optimized for operation at the operating temperature.

22. The optical arrangement according to claim 1, wherein the optical design of the optical surface is configured to change a curvature of the optical design in accordance with the temperature of the optical surface.

23. A method for providing a reflective optical element for the soft X-ray- or EUV wavelength range for operation at an operating temperature of at least 30 C with a first optical design having optical characteristics that are at least substantially optimized for the operating temperature, the method comprising:
- providing the reflective optical element at a temperature below the operating temperature with a second optical design that is selected such that the first optical design is generated after heating to operating temperature;
- wherein the first optical design comprises a first reflective multilayer system further comprising a first plurality of layers having a high refractive index alternately arranged with a first plurality of layers having a low refractive index,
- wherein the second optical design comprises a second reflective multilayer system further comprising a second plurality of layers having a high refractive index alternately arranged with a second plurality of layers having a low refractive index, and
- wherein a thickness of at least one layer of the second plurality of layers having the high refractive index, or the second plurality of layers having the low refractive index is different than a corresponding thickness of at least one layer of the first plurality of layers having the high refractive index, or the first plurality of layers having the low refractive index.

24. The method according to claim 23, wherein the second optical design is determined from the first optical design, taking into account a thermal expansion of the reflective optical element during heating to the operating temperature.

25. The method according to claim 23, wherein the reflective optical element is provided at room temperature, and the second optical design is selected such that when the reflective optical element is heated from room temperature to the operating temperature, the first optical design is generated.

26. The method according to claim 23, wherein the optical element is provided for operation in an optical arrangement, and wherein the first optical design is determined such that at least one imaging error of the optical arrangement is optimized.

27. The method according to claim 26, wherein the imaging error is selected from the group consisting of: uniformity, telecentricity, pupil ellipticity and pupil apodisation.

28. The method according to claim 23, wherein the second optical design comprises a curvature of the second optical design that differs from a curvature of the first optical design.

* * * * *

UNITED STATES PATENT AND TRADEMARK OFFICE
CERTIFICATE OF CORRECTION

| | | |
|---|---|---|
| PATENT NO. | : 7,959,310 B2 | Page 1 of 1 |
| APPLICATION NO. | : 11/854621 | |
| DATED | : June 14, 2011 | |
| INVENTOR(S) | : Dirk Heinrich Ehm et al. | |

It is certified that error appears in the above-identified patent and that said Letters Patent is hereby corrected as shown below:

Column 1 (Title page), Line 6, item "(75)": Delete "Oberkocken" and insert -- Oberkochen -- therefor In the drawings: Sheet 4 of 5 (Fig 5); Line 1: Delete "optioal" and insert -- optional -- therefor In the drawings: Sheet 4 of 5 (Fig 5); Line 2: Delete "laver" and insert -- layer -- therefor Column 12; Line 16: Delete "element" and insert -- element, -- therefor Column 12; Line 50: Delete "1" and insert -- 1, -- therefor Column 13; Line 16: Delete "26" and insert -- 25 -- therefor Column 14; Line 30: Delete "101," and insert -- 10', -- therefor Column 14; Line 52: Delete "ma de" and insert -- made -- therefor Column 14; Line 57: Delete "etch," and insert -- etc., -- therefor Column 16; Line 54: Delete "oxygen" and insert -- oxygen, -- therefor Column 18; Line 10: Delete "13," and insert -- 13', -- therefor Column 18; Line 14: Delete "1" and insert -- 1' -- therefor Column 18; Line 18: Delete "With" and insert -- with -- therefor Column 21; Line 48: In Claim 3, delete "least" and insert -- at least -- therefor Column 23; Line 3: In Claim 23, delete "30 C" and insert -- 30° C. -- therefor Signed and Sealed this
Seventh Day of August, 2012

David J. Kappos
*Director of the United States Patent and Trademark Office*